United States Patent
Good et al.

(10) Patent No.: US 8,103,478 B2
(45) Date of Patent: Jan. 24, 2012

(54) METHOD AND SYSTEM FOR SEMICONDUCTOR PROCESS CONTROL AND MONITORING BY USING PCA MODELS OF REDUCED SIZE

(75) Inventors: Richard Good, Radebeul (DE); Daniel Kost, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 474 days.

(21) Appl. No.: 12/388,060

(22) Filed: Feb. 18, 2009

(65) Prior Publication Data
US 2009/0276077 A1 Nov. 5, 2009

(30) Foreign Application Priority Data

Apr. 30, 2008 (DE) .......................... 10 2008 021 558

(51) Int. Cl.
*G01D 21/00* (2006.01)
*G06F 17/40* (2006.01)
*G06F 19/00* (2011.01)

(52) U.S. Cl. ........... 702/182; 73/865.8; 438/14; 702/81; 702/183; 702/187; 702/189

(58) Field of Classification Search ............... 73/432.1, 73/865.8, 865.9; 438/14; 700/1, 28, 29, 700/30, 31, 90, 95, 108, 109, 110, 117, 121; 702/1, 33, 34, 35, 81, 84, 127, 182, 183, 702/185, 187, 189

See application file for complete search history.

(56) References Cited

U.S. PATENT DOCUMENTS

| | | | | |
|---|---|---|---|---|
| 2,883,255 | A | * | 4/1959 | Anderson .................... 346/34 |
| 6,038,540 | A | * | 3/2000 | Krist et al. .................. 705/7.33 |
| 7,328,126 | B2 | * | 2/2008 | Chamness .................... 702/182 |
| 7,729,789 | B2 | * | 6/2010 | Blevins et al. ................. 700/83 |
| 7,937,164 | B2 | * | 5/2011 | Samardzija et al. ........... 700/28 |
| 2005/0060103 | A1 | * | 3/2005 | Chamness ...................... 702/30 |
| 2007/0005266 | A1 | * | 1/2007 | Blevins et al. ................. 702/22 |
| 2008/0082302 | A1 | * | 4/2008 | Samardzija et al. ............ 703/2 |
| 2010/0198556 | A1 | * | 8/2010 | Kost ............................. 702/183 |
| 2010/0222899 | A1 | * | 9/2010 | Blevins et al. ................. 700/80 |

FOREIGN PATENT DOCUMENTS

WO  WO 2004/105101 A2  12/2004

OTHER PUBLICATIONS

Translation of Official Communication from German Patent Office for German Patent Application No. 10 2008 021 558.9-53 dated Nov. 26, 2008.

* cited by examiner

*Primary Examiner* — Edward Cosimano
(74) *Attorney, Agent, or Firm* — Williams, Morgan & Amerson, P.C.

(57) ABSTRACT

By dividing a complex set of parameters of a production process in forming semiconductor devices into individual blocks, respective PCA models may be established for each block and may thereafter be combined by operating on summary statistics of each model block in order to evaluate the complete initial parameter set. Thus, compared to conventional strategies, a significant reduction of the size of the combined PCA model compared to a single PCA model may be obtained, while also achieving an enhanced degree of flexibility in evaluating various subsets of parameters.

20 Claims, 4 Drawing Sheets

METHOD AND SYSTEM FOR SEMICONDUCTOR PROCESS CONTROL AND MONITORING BY USING PCA MODELS OF REDUCED SIZE

BACKGROUND OF THE INVENTION

1. Field of the Invention

The present disclosure generally relates to the field of fabricating semiconductor devices, and, more particularly, to process control and monitoring techniques for manufacturing processes, wherein an improved process control quality is achieved by detecting process failures on the basis of production data.

2. Description of the Related Art

Today's global market forces manufacturers of mass products to offer high quality products at a low price. It is thus important to improve yield and process efficiency to minimize production costs. This holds especially true in the field of semiconductor fabrication, since, here, it is essential to combine cutting-edge technology with mass production techniques. It is, therefore, the goal of semiconductor manufacturers to reduce the consumption of raw materials and consumables while at the same time improve product quality and process tool utilization. The latter aspect is especially important since, in modern semiconductor facilities, equipment is required which is extremely cost-intensive and represents the dominant part of the total production costs. For example, in manufacturing modern integrated circuits, several hundred individual processes may be necessary to complete the integrated circuit, wherein failure in a single process step may result in a loss of the complete integrated circuit. This problem is even exacerbated in that the size of substrates, on which a plurality of such integrated circuits are processed, steadily increases, so that failure in a single process step may possibly entail the loss of a large number of products.

Therefore, the various manufacturing stages have to be thoroughly monitored to avoid undue waste of man power, tool operation time and raw materials. Ideally, the effect of each individual process step on each substrate would be detected by measurement and the substrate under consideration would be released for further processing only if the required specifications, which would desirably have well-understood correlations to the final product quality, were met. A corresponding process control, however, is not practical since measuring the effects of certain processes may require relatively long measurement times, frequently ex-situ, or may even necessitate the destruction of the sample. Moreover, immense effort, in terms of time and equipment, would have to be made on the metrology side to provide the required measurement results. Additionally, utilization of the process tool would be minimized since the tool would be released only after the provision of the measurement result and its assessment. Furthermore, many of the complex mutual dependencies of the various processes are typically not known, so that a priority determination of respective process specifications may be difficult.

The introduction of statistical methods, also referred to as statistical process control (SPC), for adjusting process parameters, significantly relaxes the above problem and allows a moderate utilization of the process tools while attaining a relatively high product yield. Statistical process control is based on the monitoring of the process output to thereby identify an out-of-control situation, wherein a causality relationship may be established to an external disturbance. After occurrence of an out-of-control situation, operator interaction is usually required to manipulate a process parameter so as to return to an in-control situation, wherein the causality relationship may be helpful in selecting an appropriate control action. Nevertheless, in total, a large number of dummy substrates or pilot substrates may be necessary to adjust process parameters of respective process tools, wherein tolerable parameter drifts during the process have to be taken into consideration when designing a process sequence, since such parameter drifts may remain undetected over a long time period or may not efficiently be compensated for by SPC techniques.

Recently, a process control strategy has been introduced and is continuously being improved, allowing enhanced efficiency of process control, desirably on a run-to-run basis, while requiring only a moderate amount of measurement data. In this control strategy, the so-called advanced process control (APC), a model of a process or of a group of interrelated processes is established and implemented in an appropriately configured process controller. The process controller also receives information including pre-process measurement data and/or post-process measurement data, as well as information related, for instance, to the substrate history, such as type of process or processes, the product type, the process tool or process tools, in which the products are to be processed or have been processed in previous steps, the process recipe to be used, i.e., a set of required sub-steps for the process or processes under consideration, wherein possibly fixed process parameters and variable process parameters may be contained, and the like. From this information and the process model, the process controller determines a controller state or process state that describes the effect of the process or processes under consideration on the specific product, thereby permitting the establishment of an appropriate parameter setting of the variable parameters of the specified process recipe to be performed with the substrate under consideration.

Even though APC strategies may contribute significantly to yield improvement and/or enhanced device performance and/or a reduction of production costs, nevertheless, a statistical probability exists that even process results obtained by using an APC technique may be outside of predefined value ranges, thereby resulting in yield loss. In high-volume production lines, even short delays between the occurrence of an out-of-control situation, indicating for instance an equipment failure, and its detection may therefore lead to substantial monetary losses. Consequently, it may be advantageous to apply fault detection and classification (FDC) techniques in combination with other control strategies, such as APC and/or SPC, so as to detect even subtle variations of the process sequence or the overall process, since the non-detected shift of the process may result in a large number of semiconductor devices of insufficient quality.

In conventional fault detection and classification techniques, a very large number of process parameters may have to be monitored and analyzed in order to detect a deviation from a target behavior of the manufacturing environment under consideration. As previously explained, several hundred process steps may typically be required for completing sophisticated integrated circuits, wherein each of these steps has to be maintained within specified process margins, wherein, however, the mutual interaction of the highly complex manufacturing processes on the finally obtained electrical performance of the completed device may not be known. Consequently, even a deviation of the plurality of processes within the specified process windows may result in a significant variation of the finally obtained process result. For this reason, a plurality of metrology steps are typically incorporated into the overall manufacturing flow, wherein, due to overall throughput and in view of data processing capability, typically a selected number of sample substrates may be subjected to measurement, based on which appropriate control mechanisms may be performed and also the overall quality of manufacturing sequences may be evaluated with respect to any faults. Moreover, a certain classification of detected faults may also be accomplished on the basis of the sample measurements. Although the respective measurement steps may be restricted to a defined number of samples, the continuously increasing complexity of the overall manufacturing process may require the monitoring of a large number of process parameters, such as layer thicknesses of critical process layers, such as the gate dielectric material and the like, critical dimensions of certain circuit components, such as gate electrodes, doping levels, strain levels, sheet resistivity and the like, wherein many of these process parameters may have to be monitored for a plurality of different device levels, for instance for a plurality of metallization levels and the like. Consequently, it may be extremely difficult to reliably evaluate the quality of a production process, since taking into consideration only a restricted number of process parameters may result in a less meaningful estimation since the mutual interactions of the various process steps may not be known in advance, while monitoring a high number of process parameters may involve complex data processing algorithms so as to detect relevant parameters and their deviation from target values on the basis of very large data sets.

For this reason, efficient statistical data processing algorithms may be used, which may enable a significant reduction of the high dimensionality of the parameter space, while substantially not losing valuable information on the intrinsic characteristics of the overall process flow, which may be encoded into the measurement data in a more or less subtle manner. One powerful tool for evaluating a large number of measurement data relating to a large number of parameters is the principle component analysis, which may be used for efficient data reduction. Typically, the principal component analysis (PCA) may be used for fault detection and classification by establishing a "model" of the process sequence under consideration, in that appropriately selected measurement data, which may act as reference data, may be used to identify respective "new" parameters as a linear combination of the many process parameters under consideration, wherein the new parameters or principal components may represent respective entities having the most influence on the variability of the input process parameters. Thus, typically, a significantly reduced number of new parameters may be identified which may be "monitored" in order to detect a deviation in measurement data obtained on the basis of the high dimensional parameter space. When the initial measurement data, for which a corresponding data reduction may have been performed, are considered "good" data, the respective transformations and correlation and co-variance components may be used as a model, which may be applied to other measurement data relating to the same set of parameters in order to determine deviation between the model prediction and the current measurement data. When a corresponding deviation is detected, the measurement data evaluated by the PCA model may thus be indicated as referring to a faulty state of the manufacturing environment. A corresponding deviation may be determined on the basis of statistical algorithms, as will be explained later on in more detail, so that the PCA model in combination with the statistical algorithms may allow an efficient detection and also classification of the status of the manufacturing environment corresponding to the available measurement data.

Although the PCA algorithm provides a powerful tool for detecting faults during the production of semiconductor devices, the number of parameters to be monitored may steadily increase due to the increasing complexity of the overall manufacturing flow, as previously explained. However, the model size of the PCA models increases quadratically in relation to the number of parameters used in the model, since typically respective mutual correlations are to be used in the PCA algorithm. That is, doubling the number of parameters will increase the size of the PCA model four-fold. The increase in model size, however, results in an increase of time and computer memory required to build and update the PCA models. Consequently, due to the increased number of process steps involved and the increased complexity of the semiconductor equipment, as well as the finally obtained products, an increasing number of parameters has to be monitored, thereby also contributing to an even greater increase of the corresponding PCA models. Due to the limited resources with respect to storage space and computational power, the creation and updating of PCA models may thus require extremely large resources, thereby rendering the entire PCA strategy for fault detection and classification less attractive.

For this reason, other algorithms are typically used for multivariate fault detection wherein two popular algorithms include the "k" nearest neighbor (KNN) approach and ordinary multivariate analysis (OMA). The KNN model sizes are generally smaller than the respective PCA models but are computationally more demanding and thus require increased computational resources. Furthermore, the results of KNN fault detection mechanisms are often considerably different compared to the results obtained by PCA, and the interpretation of KNN results is less comprehensive compared to the PCA results.

On the other hand, OMA has the advantage of being computationally efficient and thus inexpensive while, however, the fault detection method may not be as robust compared to PCA mechanisms. A correlation between at least some of the measured parameters is common in semiconductor manufacturing processes and this is the reason why the OMA method may create many "false alarms."

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and systems for fault detection and classification in manufacturing processes for producing semiconductor devices, wherein a significant reduction of PCA models may be accomplished for a given set of parameters to be monitored, thereby enhancing the overall handling of the measurement data substantially without sacrificing the accuracy of the PCA results or even by enhancing the robustness of the corresponding models. To this end, a multi-dimensional parameter set, as may be required for assessing a respective manufacturing environment, may be divided into a plurality of subsets of parameters, which may then be separately modeled, thereby obtaining a low number of summary statistic values. Thereafter, the summary statistic values may be appropriately combined to obtain a combined model for evaluating the initial parameter set as a whole. Since the size of PCA models increases quadratically with the number of parameters, the size of the sum of the individual PCA models is significantly smaller compared to a single PCA model covering the initial entire parameter set.

One illustrative method disclosed herein comprises obtaining a plurality of historical measurement data sets, each of which relates to a respective parameter set and is measured during the processing of semiconductor devices in a manufacturing environment. The method further comprises establishing a model for each respective parameter set by using a principal component analysis technique and a respective one of the plurality of measurement data sets related to the respective parameter set. Moreover, a first and a second measurement data set corresponding to a measurement data set corresponding to a first parameter set and a second parameter set, respectively, are obtained. The method further comprises applying a first model corresponding to the first parameter set to the first measurement data set and applying a second model corresponding to the second parameter set to the second measurement data set. Finally, the first and second measurement data sets are evaluated by combining a first statistical value set obtained from the first model and a second statistical value set obtained from the second model.

A further illustrative method disclosed herein relates to the fault detection in a semiconductor manufacturing process. The method comprises applying a first PCA model to a first set of measurement data that is related to a process result of the semiconductor manufacturing process and that corresponds to a first parameter set. The method further comprises determining a first set of summary statistical values for evaluating the first parameter set. Furthermore, a second PCA model is applied to a second set of measurement data related to the process result of the semiconductor manufacture process and corresponding to a second parameter set. Additionally, the method comprises determining a second set of summary statistical values for evaluating the second parameter set and combining the first and second sets of summary statistical values so as to commonly evaluate the first and second measurement data.

An illustrative fault detection system disclosed herein comprises a database comprising a plurality of PCA models and a corresponding set of statistical key values obtained by applying each PCA model to a respective set of measurement data that correspond to a respective set of process parameters to be monitored during the processing of semiconductor devices. The fault detection system further comprises a fault detection module connected to the database and configured to retrieve summary statistics of at least some of the PCA models and to combine the at least some summary statistics so as to provide a combined statistical evaluation of at least some of the parameter sets.

BRIEF DESCRIPTION OF THE DRAWINGS

The disclosure may be understood by reference to the following description taken in conjunction with the accompanying drawings, in which like reference numerals identify like elements, and in which.

Figure 1A:
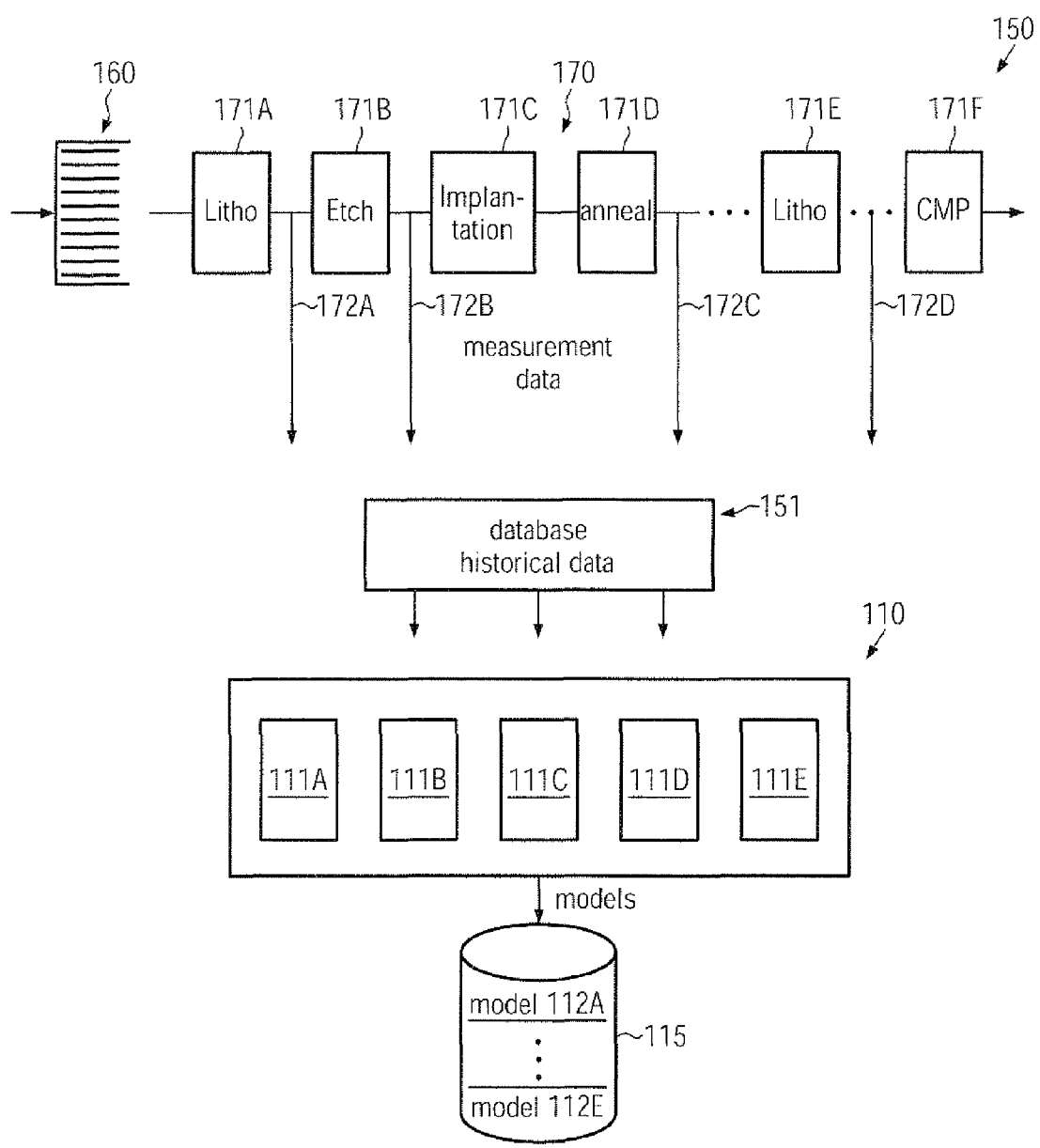
FIG. 1a schematically illustrates a manufacturing environment for producing semiconductor devices and a system for generating PCA models on the basis of historical data, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques and systems in which PCA models may be generated and applied to measurement data corresponding to a plurality of parameters, wherein the overall size of a model for evaluating the parameters may be reduced compared to conventional strategies in that appropriately selected subsets of the parameters may be used for determining a corresponding model of smaller size, wherein finally the plurality of individual models may be combined on the basis of statistical values obtained from each individual model. Consequently, high dimensional parameter sets, as are typically encountered in fault detection and classification of semiconductor manufacturing processes, may be processed with a significantly reduced amount of computational resources compared to conventional strategies using PCA models, while an enhanced robustness and intelligibility of the evaluation results may also be obtained compared to other approaches, such as KNN strategies, OMA techniques and the like. Consequently, the principles disclosed herein provide significantly faster modeling results, for instance with respect to building or updating models, which may take several hours or which may even not allow handling a desired parameter set of high dimensionality. Moreover, the resources with respect to storage space may be significantly reduced compared to conventional strategies, while nevertheless providing the same degree of accuracy or even an enhanced degree of accuracy. Additionally, due to the provision of individual smaller PCA model blocks, a reduced measurement data set may be required to create a robust model, thereby enabling more frequent updating of the corresponding models, thereby contributing to fault detection strategy with enhanced efficiency. In some illustrative aspects disclosed herein, the PCA models may be built on the basis of distributed computing, thereby allowing an efficient use of computational resources. That is, smaller PCA blocks may be processed by a respective one of components of a data processing system since the blocks may be handled independently from each other, and finally a combination of the corresponding model blocks may be accomplished by operating on a low number of statistical values produced by each model block. In other illustrative aspects disclosed herein, enhanced flexibility may be accomplished for fault detection mechanisms by providing appropriate summary statistics, for instance by providing performance metrics for groups of measurement data. For example, substrates can be combined by determining respective model predictions for each of the substrates and hence a performance metric may be determined for the entirety of the substrates, which may be difficult to be achieved on the basis of conventional strategies, since the operation on one single large parameter set may require a larger measurement data set for each of the parameters, while also the computational resources required and the significantly increased computation time compared to the present disclosure may be practically prohibitive for obtaining corresponding statistical performance metrics with increased "granularity." Thus, according to the principles disclosed herein, groups of substrates may be combined to obtain performance of a certain product type and similarly products may be combined to provide an evaluation of the performance of a certain technology used for fabricating the devices and the like. In other illustrative embodiments disclosed herein, the PCA models may be selected "on demand," depending on the parameter set to be evaluated. That is, since the PCA models may be generated with a desired degree of resolution compared to process parameters, respective subsets of the parameters may be selected for the evaluation while a corresponding combined model may then be established by appropriately selecting the PCA models associated with the selected subsets of the parameters. Furthermore, upon introducing "new" parameters to be monitored, a corresponding model may be established and may be added to the PCA model database, without requiring a modification of the previously established models. Hence, a high degree of scalability of a fault detection mechanism may be accomplished on the basis of the principles disclosed herein.

FIG. 1a schematically illustrates a manufacturing environment 150 which, in one illustrative embodiment, represents a manufacturing environment for producing semiconductor devices, such as integrated circuits, micromechanical systems, optoelectronic components and the like. The environment 150 may comprise a plurality of process tools and metrology tools (not shown) which may be used for performing a plurality of process steps which are considered to include actual production processes and metrology processes. For example, the environment 150 may comprise a plurality of lithography tools, etch tools, implantation tools, anneal tools, deposition tools, chemical mechanical polishing (CMP) tools and the like. Thus, respective substrates 160, which may typically be handled in the environment 150 in the form of groups or lots, may be supplied to the environment 150 on the basis of appropriate resources, such as automatic or semiautomatic transport systems (not shown) and the like. Thereafter, the substrates 160 may be staged through a plurality of process tools according to a specified overall manufacturing flow as may be required for the product type represented by the substrates 160. It should be appreciated that some or more of the process tools in the environment 150 may be used several times, depending on the corresponding manufacturing stage of the substrates 160. Thus, a sequence of manufacturing processes, including metrology processes, may be established in the environment 150, thereby defining an overall manufacturing flow 170, which may comprise a plurality of individual manufacturing processes and process sequences, indicated as 171A, 171B, 171C, 171D, 171E, 171F. Thus, during the processing of the substrates 160, a plurality of metrology processes may be performed, thereby producing respective measurement data sets 172A, 172B, 172C, 172D, wherein each measurement data set 172A, 172B, 172C, 172D may correspond to a respective parameter set that is to be monitored in order to estimate the process results of the various processes during the manufacturing flow 170. It should be appreciated that the manufacturing flow 170 may not necessarily result in completed semiconductor devices but may also include situations in which at least a specified degree of "completeness" of the semiconductor device under consideration is to be accomplished. For instance, one or more process modules of the overall manufacturing environment in which a plurality of correlated manufacturing steps may be performed may be considered as the manufacturing environment 150, if a sophisticated and robust monitoring of the overall quality of the process flow 170 within the corresponding process module may be required. Typically, the measurement data sets 172A, 172B, 172C, 172D may be provided to a data processing system 151, which may represent any appropriate control mechanism, such as a manufacturing execution system (MES), that may be responsible for the material transport within the environment 150 and the coordination of the respective process tools so as to establish a highly efficient schedule for staging the substrates 160 according to a specified product type through the manufacturing processes 171A, 171B, 171C, 171D, 171E, 171F.

The data processing system 151 may further comprise a database for obtaining the measurement data 172A, 172B, 173C, 172D, wherein corresponding data may be qualified as historical data, i.e., when the measurement data are considered as representing a state of the environment 150 of a specific quality standard. Consequently, the historical data collected by the data processing system 151 may be used as reference data for forming a plurality of PCA models by a model generator 110. The model generator 110 may be configured to receive historical data from the system 151 and to divide the historical data into a plurality of data sets, each corresponding to a specific parameter set according to a predefined strategy. In one illustrative embodiment, the respective parameters to be observed during the manufacturing flow 170 may be divided into groups of substantially independent parameters so that each set of parameters may be treated independently for establishing a corresponding PCA model. For example, parameters relating to corresponding process steps in the manufacturing flow 170 which are not correlated to each other may be considered as independent parameters. For example, the layer thickness of a material layer deposited after performing a plurality of process steps, which may result in a substantially planar surface topography, may be considered as substantially independent from the process sequence previously performed and may therefore be grouped into a different parameter set compared to the previously performed processes. Conversely, the critical dimensions obtained after performing a lithography process and after performing the actual etch process for transferring resist features into an underlying material layer, such as during the patterning of gate electrode structures, may not be considered as independent parameters and may therefore be grouped into the same set of parameters. Consequently, for a large number of parameters, which may add up to several hundred parameters in a complex manufacturing environment, an appropriate grouping of independent parameter sets may be established wherein, as previously explained, a high degree of flexibility may be accomplished since "new" parameters may be added by creating a new parameter set, without requiring a change of the previously established parameter groups and the corresponding PCA models related thereto. The model generator 110 may therefore request the historical data in accordance with the predefined grouping of the respective parameters and may establish a PCA model for each parameter set. In some illustrative embodiments, the model generator 110 may comprise a plurality of independent data processing systems 111A, 111B, 111C, 111D, 111E which may be considered as individual model engines for establishing a PCA model on the basis of historical measurement data related to a respective set of parameters, as described above. That is, the generator 110 may provide "parallel" data processing by using at least some of the engines 111A, 111B, 111C, 111D, 111E which may result in a significantly reduced overall process time. For example, several CPUs (central processing units) may be provided to simultaneously process a respective portion of the historical data in order to establish a plurality of independent PCA models, which may then be appropriately combined to obtain an overall model for covering the entire parameter set of interest, substantially without losing information, or even with enhanced robustness, since typically a reduced amount of measurement data may be sufficient for creating a stable PCA model with a reduced size. After establishing a required number of PCA models corresponding to grouping of the initial parameters, as will be described later on in more detail, the system 110 may store the corresponding PCA models, i.e., the respective elements of matrices relating to the PCA model, in a database 115. As previously indicated, the corresponding elements of the respective matrices may be significantly reduced in number compared to a single PCA model accommodating the parameter set in its entirety due to the square relationship between the number of parameters and the corresponding coefficients used in the respective PCA models. Consequently, contrary to conventional strategies, the database 115 may require a significantly reduced amount of storage capacity.

During operation of the model generating system 110, the historical data may be obtained and may be divided into respective measurement data sets, as discussed above. During the building of a PCA model, the measurement data, which may typically be represented by a data matrix X, is decomposed into a model component and a residual component, as is described by Equations 1.

$$X = \hat{X} + \tilde{X}$$

$$\hat{X} = TP^T$$

$$\tilde{X} = \tilde{T}\tilde{P}^T \tag{1}$$

Here, $\hat{X}$ represents the modeled portion of the data matrix while $\tilde{X}$ represents the residual component, i.e., the less relevant components. As shown in Equations 1, the modeled portion $\hat{X}$ may thus be represented by the product of the matrix including in the first 1 eigenvectors of the correlation matrix R and the matrix of the respective "loadings" indicating the contribution of the initial data vectors to the finally obtained principal components or eigenvectors of the correlation matrix R. The PCA mechanism is a data transformation in which the vectors in the high dimensional parameter space, represented by various measurement samples for a corresponding parameter, may be mapped into a parameter space, which comprises an orthogonal basis, wherein the respective base vectors are obtained such that the first base vector indicates the direction of maximum variance while the second base vector represents the direction of the second most variance, and so on. By selecting few base vectors or principal components, substantially most of the variability of the input data may be covered, thereby rendering the remaining eigenvectors as less important for evaluating the respective measurement data. Consequently, by selecting the few principal components, the number of dimensions of the parameter space to be taken into consideration may be significantly reduced, substantially without losing relevant information with respect to the initially input measurement values and thus parameters.

It should be appreciated that, due to "rotation" of the base vectors or principal components in the high dimensional parameter space, the respective principal components may represent "new" parameters, which may be understood as a linear combination of the previously input parameters. Thus, $\hat{X}$ may therefore represent the modeled portion including the principal components, while $\tilde{X}$ may be obtained by the respective matrices corresponding to the less significant vectors of the correlation matrix R. The correlation matrix R may be represented as indicated by Equation 2.

$$R = \frac{1}{n-1} X^T X \tag{2}$$

Consequently, by establishing the respective matrices as pointed out in Equations 1 and 2, an appropriate PCA model may be established, which may then be "applied" to other measurement data obtained for the same parameter set. The corresponding measurement data may then be considered as normal if certain statistical limits may not be exceeded. For this purpose, two types of errors are considered when applying PCA models during fault detection and classification techniques. The first type, i.e., a squared prediction error (SPE), may characterize how much a sample, i.e., measurement data to be evaluated, deviates from the model according to Equation 3.

$$SPE = x\tilde{P}\tilde{P}^T x^T \tag{3}$$

Another type of error is characterized by $T^2$ and indicates how much a sample deviates within the model, as is expressed by Equation 4.

$$T^2 = xP\Lambda^{-1}P^T x^T \quad (4)$$

In Equation 4, $\Lambda$ represents the matrix of the eigenvalues corresponding to the matrix P of the principal components. Based on these types of errors created by applying the model to a measurement sample, the corresponding process in which the measurement sample has been obtained is considered as "normal" if:

$$SPE \leq \delta^2$$

$$T^2 \leq \tau^2 \quad (5)$$

wherein $\delta^2$ and $\tau^2$ represent respective statistical limits for the errors SPE and $T^2$. From both errors SPE, $T^2$, a combined index P may be defined as the sum of both errors, weighted by their corresponding statistical limits as specified in Equation 5. The combined index may thus be expressed as:

$$\varphi = \frac{SPE}{\delta^2} + \frac{T^2}{\tau^2} \quad (6)$$

Hence, a process producing the respective sample measurement data is considered normal if:

$$\varphi \leq \zeta^2 \quad (7)$$

This may also be expressed in a normalized manner by introducing the entity $\varphi_r$ which has to be equal to or less than 1, wherein $\varphi_r$ is expressed by:

$$\varphi_R \equiv \log\left(\frac{\varsigma}{\tau^2}\right) + 1 \quad (8)$$

The corresponding statistical limits $\delta^2$ and $\tau^2$, V and $\zeta^2$ may be calculated, for instance, by using the $\chi^2$ inverse function, wherein the $\chi^2$ distribution or function is a theoretical probability distribution, which may most efficiently be used for characterizing the distribution of respective quantities. Thus, for the model prediction error SPE, the corresponding statistical limit $\delta^2$ may be calculated by:

$$\delta^2 = \frac{tr(R^2 \tilde{P}\tilde{P}^T)}{tr(R\tilde{P}\tilde{P}^T)} x^2 \left(0.99, \frac{[tr(R\tilde{P}\tilde{P}^T)]^2}{tr(R^2 \tilde{P}\tilde{P}^T)}\right) \quad (9)$$

As shown, the statistical limit for the prediction error SPE may be obtained on the basis of the correlation matrix, the square of the correlation matrix and the matrix including the residual eigenvectors, which may not be used as principal components.

The model internal error $T^2$ may be obtained by:

$$\tau^2 = x^2(0.99, l) \quad (10)$$

From the above Equations 9 and 10, the statistical limit for the combined index $\varphi$ may be obtained according to:

$$\varsigma^2 = \frac{\frac{tr(R^2 \tilde{P}\tilde{P}^T)}{(\delta^2)^2} + \frac{l}{(\tau^2)^2}}{\frac{tr(R\tilde{P}\tilde{P}T)}{\delta^2} + \frac{l}{\tau^2}} x^2 \left(0.99, \frac{\left[\frac{tr(R\tilde{P}\tilde{P}^T)}{\delta^2} + \frac{l}{\tau^2}\right]}{\frac{tr(R^2\tilde{P}\tilde{P}^T)}{(\delta^2)^2} + \frac{l}{(\tau^2)^2}}\right) \quad (11)$$

Thus, for evaluating a measurement sample, that is, determining the combined index $\varphi_r$, five summary statistics may be used, that is:

(1) $tr_1$, that is, the trace of the matrix R and PT $$tr_1 = tr(R\tilde{P}\tilde{P}^T) \quad (12)$$

(2) $tr_2$, that is, the trace of the matrix $R^2$ PPT $$tr_2 = tr(R^2 \tilde{P}\tilde{P}^T) \quad (13)$$

(3) The number of principal components l or PC
(4) SPE and
(5) $T^2$

On the basis of the above-described process, the model generating system 110 may create respective matrices for each of a plurality of parameter sets on the basis of the historical measurement data so that the corresponding matrices P, PT and $\lambda$, as may be required for calculating the errors SPE and $T^2$, in combination with the parameters $tr_1$, $tr_2$ and the number of principal components, may be stored in the database 115. Hence, a plurality of models 112A ... 112E may be maintained in the database 115 according to a specific grouping of corresponding parameters, as previously explained.

Figure 1B:
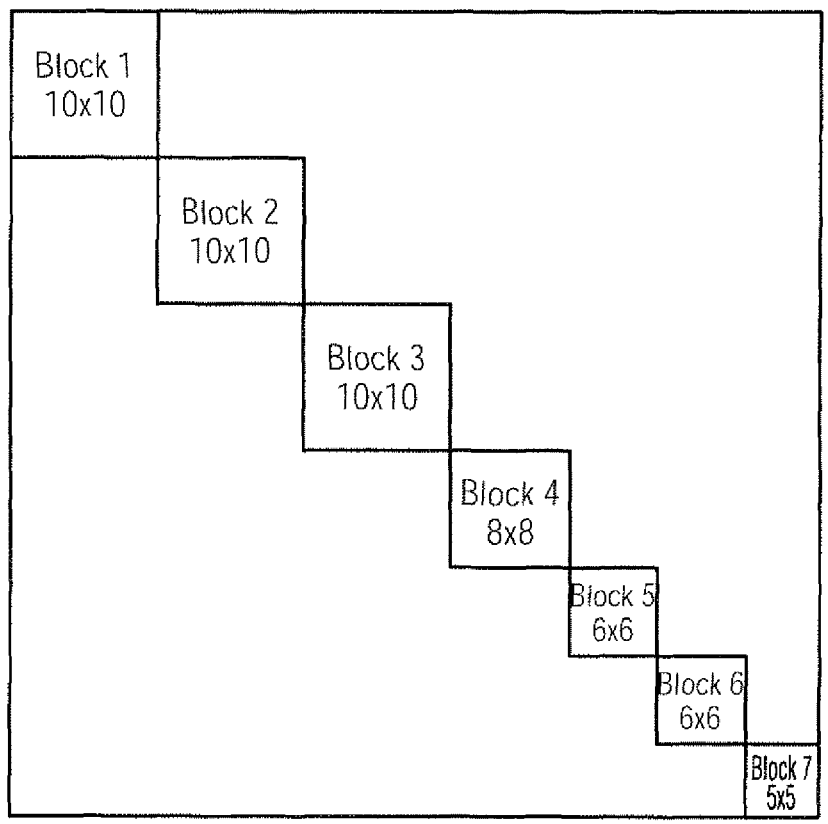
FIG. 1b schematically illustrates a plurality of individual model blocks which may be combined to an overall model, according to illustrative embodiments.

FIG. 1b schematically illustrates an example for providing a plurality of models, for instance seven models, by using respective covariance matrices, illustrated as blocks 1-7. In this example, it may be assumed that blocks 1-3 may each represent 10 parameters, while block 4 may represent 8 parameters, block 5 may represent 6 parameters, block 6 may represent 6 parameters and block 7 may represent 5 parameters. Hence, in a conventional fault detection strategy using a PCA model, the combined parameter set of 55 parameters would require 3,025 coefficients, which may result in the requirement of significant resources with respect to data storage and computational capacity, as previously explained. On the other hand, by applying the strategy disclosed above, each of blocks 1-7 may be treated independently, wherein it may be assumed that the corresponding parameters represented by blocks 1-7 may be substantially independent from each other. Hence, seven PCA models may be required, wherein 461 coefficients may have to be used, which is significantly less compared to the conventional strategy. Thus, after establishing respective PCA models for blocks 1-7, as described above, the individual models may be combined to accommodate any subset, that is, any combination of the parameter sets related to the blocks 1-7, wherein, of course, a combined model may also be established, which encompasses all 55 parameters.

The combination of two or more of the PCA blocks 1-7 may be accomplished on the basis of the following strategy.

For each of the blocks 1-7, the corresponding summary statistics, as previously explained, i.e., $tr_1$, $tr_2$, the number of principal components L, SPE and $T^2$ may be determined for each block for a respective measurement sample corresponding to the respective block, in order to determine the quality of the corresponding subset of parameters involved in the manufacturing processes of interest. For example, a respective block of information as illustrated in Table 1 may be stored in an appropriate storage, such as the database 115, which may be accessed by a fault detection system when applying the models 112A . . . 112E in obtaining the respective statistical summary values, as explained above.

TABLE 1

| Block | Tr(1) | Tr(2) | PC | SPE | T2 | PhiR |
|---|---|---|---|---|---|---|
| 1 | 5.27 | 4.54 | 3 | 9.59 | 8.06 | 0.95 |
| 2 | 4.34 | 1.14 | 3 | 8.76 | 9.71 | 1.08 |
| 3 | 2.31 | 2.33 | 4 | 4.68 | 5.50 | 0.78 |
| 4 | 4.18 | 5.93 | 2 | 5.23 | 6.70 | 0.86 |
| 5 | 6.27 | 5.70 | 3 | 6.25 | 4.27 | 0.69 |
| 6 | 9.07 | 3.15 | 3 | 7.62 | 10.75 | 0.96 |
| 7 | 5.29 | 3.86 | 5 | 14.11 | 7.23 | 0.98 |
| 8 | 2.75 | 6.77 | 2 | 9.66 | 10.71 | 1.09 |

In order to obtain a desired combined model prediction, it may be operated on the summary statistics of the corresponding blocks, for which a combination is desired. In the following it may be assumed that evaluation of the manufacturing process with respect to all 55 parameters is desired.

Thus, the respective statistical limits for the combined blocks 1-7 may be obtained by using the sum of the corresponding statistics $tr_1$, $tr_2$ for each of the blocks 1-7, as expressed by Equation 14.

$$\delta^2 = \frac{\sum tr_2}{\sum tr_1} x^2 0.99, \left(\frac{[\sum tr_1]^2}{\sum tr_2}\right) \quad (14)$$

Similarly, the statistical limit $\tau^2$ may be obtained on the basis of the sum of the principal components of the blocks 1-7, as indicated by Equation 15.

$$r^2 = x^2(0.99, \Sigma l) \quad (15)$$

The combined statistical limit $\zeta^2$ may be obtained by using the sum of the corresponding statistics as expressed in Equation 16.

$$\varsigma^2 = \frac{\frac{\sum tr_2}{(\delta^2)^2} + \frac{\sum l}{(r^2)^2}}{\frac{\sum tr_1}{\delta^2} + \frac{\sum l}{r^2}} x^2 0.99, \frac{\frac{\sum tr_1}{\delta^2} + \frac{\sum l}{r^2}}{\frac{\sum tr_2}{(\delta^2)^2} + \frac{\sum l}{(r^2)^2}} \quad (16)$$

Hence, on the basis of these statistical limits for the combinations of blocks 1-7, the combined index $\phi$ for evaluating the entire 55 parameters may be obtained according to Equation 17, and finally the combined index $\phi_r$ may be obtained by using Equation 17, thereby yielding Equation 18.

$$\varphi = \frac{\sum SPE}{\delta^2} + \frac{\sum T^2}{r^2} \quad (17)$$

$$\varphi_R \equiv \log\left(\frac{\sum}{\pi^2}\right) + 1 \quad (18)$$

Hence, by operating on the five summary statistics of each block, a combined model may be obtained which may therefore be applied to the entirety of blocks 1-7 or any combination of these blocks. For example, Table 2 illustrates a corresponding result of the above combination process.

TABLE 2

| Block | Tr(1) | Tr(2) | PC | SPE | T2 | PhiR |
|---|---|---|---|---|---|---|
| 1 | 5.27 | 4.54 | 3 | 9.59 | 8.06 | 0.95 |
| 2 | 4.34 | 1.14 | 3 | 8.76 | 9.71 | 1.08 |
| 3 | 2.31 | 2.33 | 4 | 4.68 | 5.50 | 0.78 |
| 4 | 4.18 | 5.93 | 2 | 5.23 | 6.70 | 0.86 |
| 5 | 6.27 | 5.70 | 3 | 6.25 | 4.27 | 0.69 |
| 6 | 9.07 | 3.15 | 3 | 7.62 | 10.75 | 0.96 |
| 7 | 5.29 | 3.86 | 5 | 14.11 | 7.23 | 0.98 |
| 8 | 2.75 | 6.77 | 2 | 9.66 | 10.71 | 1.09 |
| Total | 39.47 | 33.43 | 25 | 65.90 | 62.93 | 1.09 |

Consequently, measurement data relating to 55 parameters according to blocks 1-7 may be evaluated on the basis of eight individual PCA models, which may be stored in the database 115, as previously explained. Thus, compared to a single PCA model covering the 55 parameters, a significant advantage in view of computational resources and storage may be accomplished, wherein the enhanced efficiency may be even more pronounced as the number of parameters to be monitored may increase.

Figure 1C:
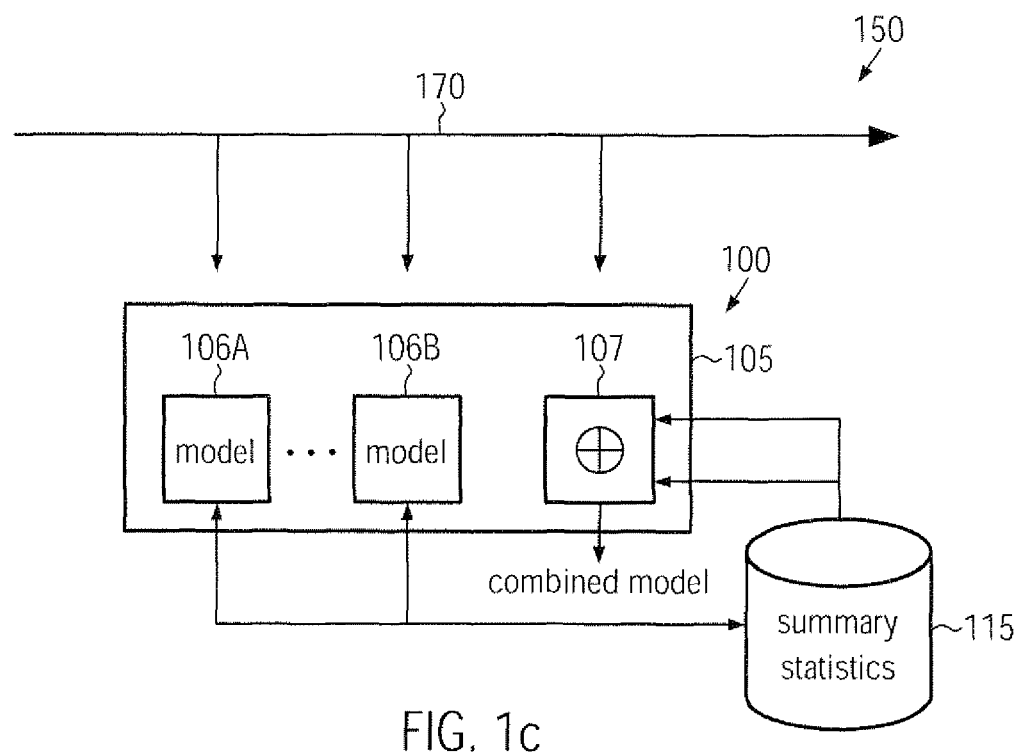
FIG. 1c schematically illustrates the manufacturing environment including a fault detection system in which PCA models may be applied to a complex set of parameters by using summary statistics obtained by a plurality of models, each of which relates to a subset of the parameters, according to illustrative embodiments.

FIG. 1c schematically illustrates the environment 150 in which a fault detection system 100 may be provided, which may be configured to receive measurement data from the manufacturing flow 170, or at least a portion thereof, wherein the corresponding measurement data may correspond to a specified set of parameters, as previously explained. The system 100 may comprise a database, which, in some illustrative embodiments, may be the database 115. Hence, a plurality of PCA models may be stored in the database 115, which may be retrieved by a fault detection module 105, wherein the corresponding models may be retrieved as required by the parameter sets to be evaluated, as discussed above. In some illustrative embodiments, the fault detection module 105 may comprise a plurality of modules 106A, 106B which may be operated independently so as to apply a specific model retrieved from the database 115. For example, each of the modules 106A, 106B may have implemented therein a mechanism, as previously explained, to generate summary statistics for a respective model, wherein the corresponding statistics may then be stored in the database 115. It should be appreciated that, in other illustrative embodiments, a single data processing system may be used when a substantially parallel evaluation of a complex measurement data set may not be required. The module 105 may further comprise a combination module 107, which is configured to retrieve respective summary statistics from the database 115 and operate thereon so as to establish appropriate statistical values for evaluating the entirety of measurement data, or any appropriate subset of measurement data, as discussed above. For example, the combined statistical value $V_r$ may be calculated on the basis of the summary statistics, as, for instance, shown in Table 1, by using the mechanism as described with reference to Equations 14-18, in order to obtain the desired value $V_r$.

As a result, the present disclosure relates to systems and techniques for evaluating complex measurement data sets relating to a plurality of parameters, wherein the parameters may be grouped and may be separately modeled by PCA techniques, thereby significantly reducing the amount of computation time and storage place. A combined model may be established by appropriately operating on summary statistics, thereby providing a high degree of flexibility in combining respective parameter blocks. Thus, an efficient fault detection mechanism may be implemented into a manufacturing environment for producing semiconductor devices, wherein, due to the increased efficiency of fault detection, groups of measurement may be treated in accordance with any desired strategy, which may be difficult to achieve according to conventional techniques in which a single high dimensional PCA model may be used for assessing a plurality of process parameters. For instance, in some illustrative embodiments, measurement data corresponding to a plurality of parameters and associated with a single substrate may be appropriately assessed on the basis of the above-described techniques and this procedure may be applied to a plurality of substrates, such as a lot, in order to establish performance-related matrices for individual substrates, lots and the like. That is, measurement data may be grouped and evaluated so as to be associated with lots of substrates, while in other cases the entirety of a certain product type, at least a significant portion thereof, may be combined in any form by using the respective measurement data to obtain an evaluation of the corresponding underlying technology standard. Hence, fault detection and classification may be accomplished with a desired degree of "granularity" by using the highly efficient PCA approach, as described above.

Figure 2:
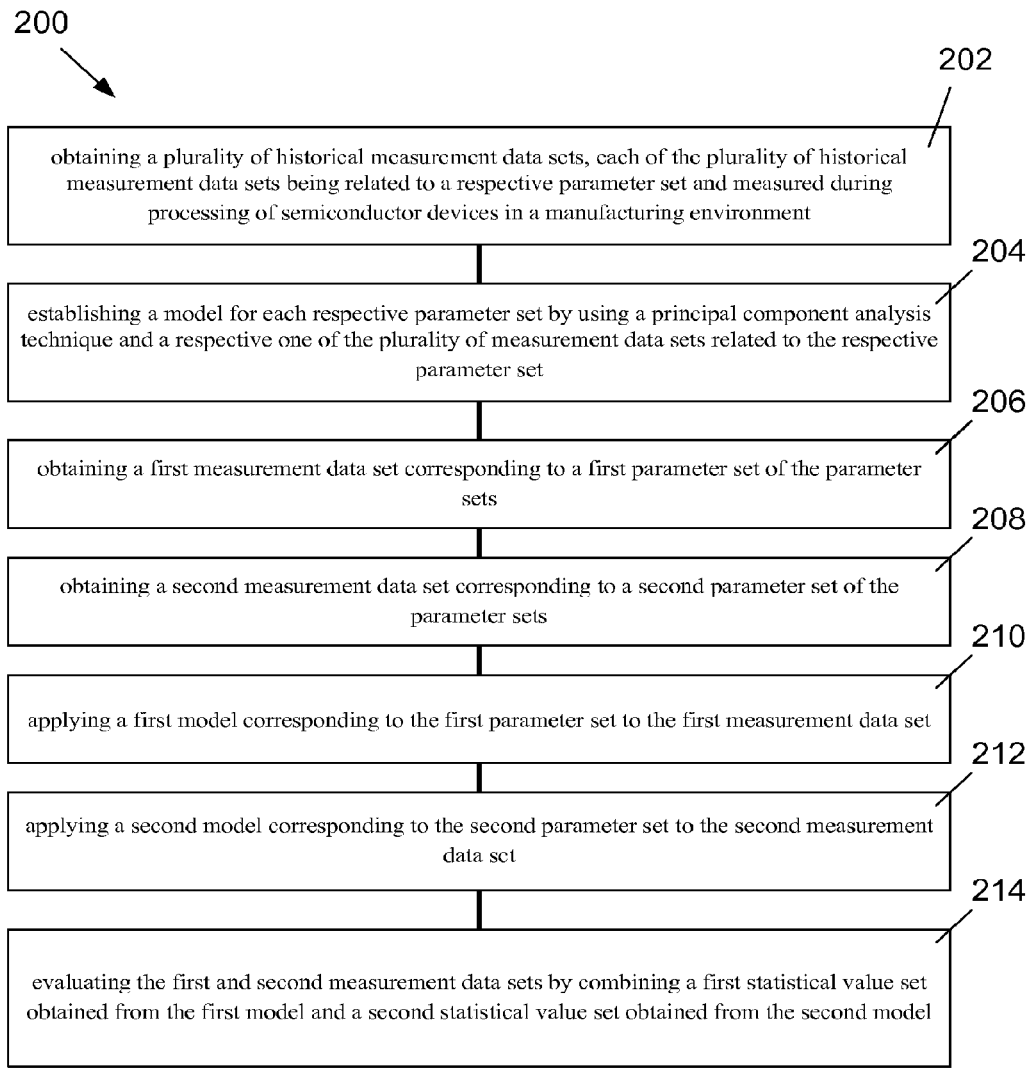
FIG. 2 depicts in flowchart form one illustrative method disclosed herein.

FIG. 2 depicts in flowchart form one illustrative method 200 disclosed herein. The method 200 is generally comprised of the steps of obtaining a plurality of historical measurement data sets, wherein each of the plurality of historical measurement data sets related to a respective parameter set and measured during processing of semiconductor devices in a manufacturing environment, as indicated in block 202, establishing a model for each respective parameter set by using a principal component analysis technique and a respective one of the plurality of measurement data sets related to the respective parameter set, as indicated in block 204 and obtaining a first measurement data set corresponding to a first parameter set of the parameter sets, as reflected in block 206. The illustrative method 200 further includes the steps of obtaining a second measurement data set corresponding to a second parameter set of the parameter sets, as indicated in block 208, applying a first model corresponding to the first parameter set to the first measurement data set, as set forth in block 210, applying a second model corresponding to the second parameter set to the second measurement data set, as indicated in block 212 and evaluating the first and second measurement data sets by combining a first statistical value set obtained from the first model and a second statistical value set obtained from the second model, as set forth in block 214.

Figure 3:
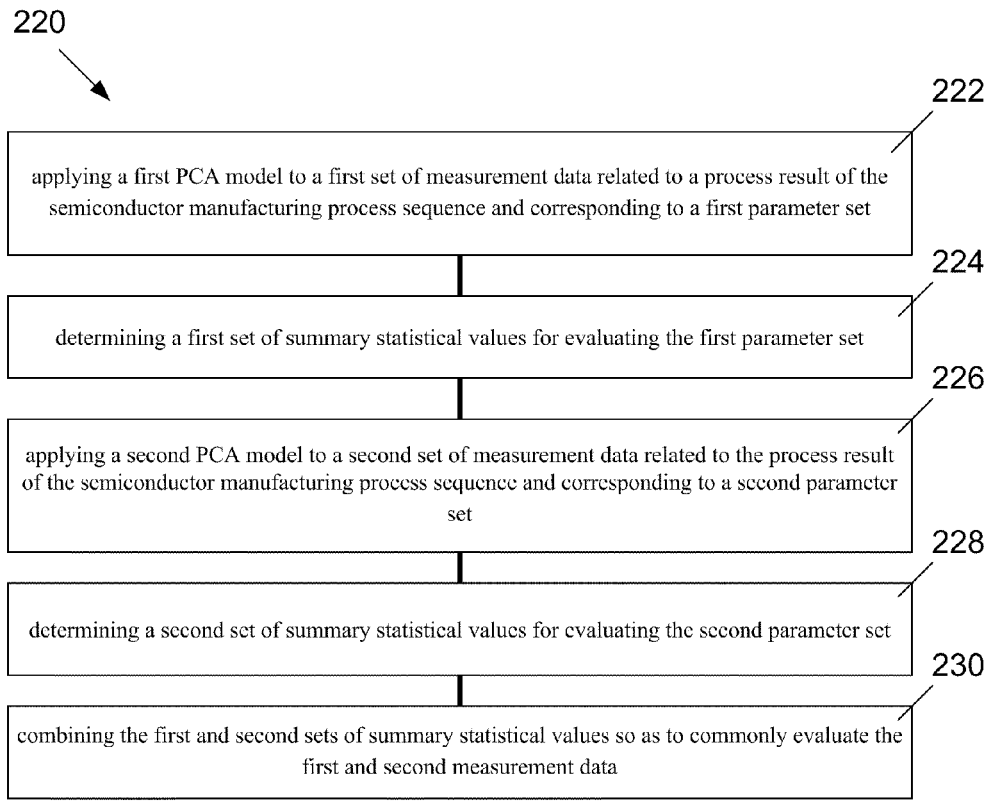
FIG. 3 depicts in flowchart form one illustrative method disclosed herein involving fault detection in a semiconductor manufacturing process sequence.

FIG. 3 depicts in flowchart form another illustrative method 220 disclosed herein involving fault detection in a semiconductor manufacturing process sequence. As shown therein, the method 220 generally comprises the steps of applying a first PCA model to a first set of measurement data related to a process result of said semiconductor manufacturing process sequence and corresponding to a first parameter set, as set forth in block 222, determining a first set of summary statistical values for evaluating the first parameter set, as indicated in block 216, and applying a second PCA model to a second set of measurement data related to the process result of the semiconductor manufacturing process sequence and corresponding to a second parameter set, as depicted in block 226. The illustrative method 220 includes the further steps of determining a second set of summary statistical values for evaluating the second parameter set, as set forth in block 228, and combining the first and second sets of summary statistical values so as to commonly evaluate the first and second measurement data, as set forth in block 230.

Figure 4:
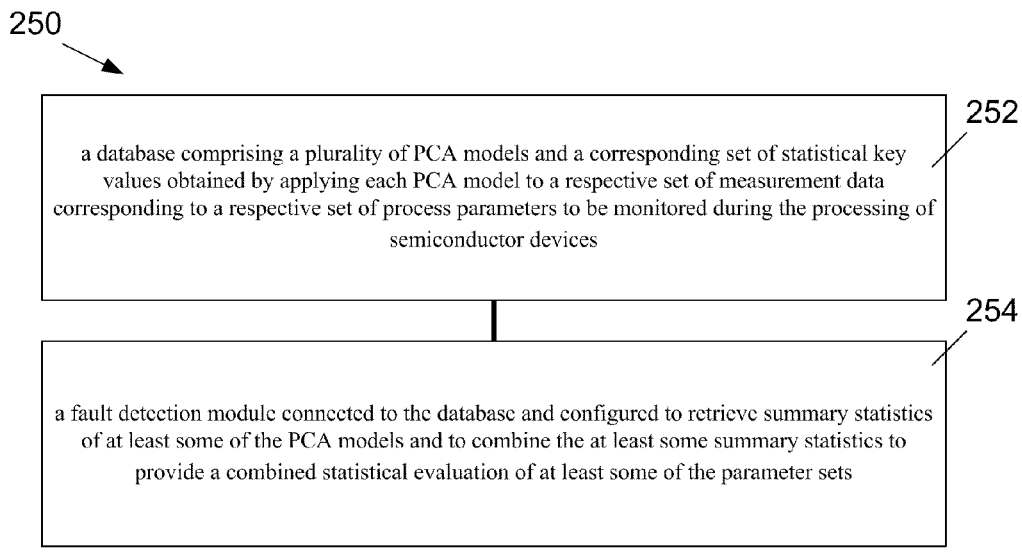
FIG. 4 is a block diagram depiction of one illustrative embodiment of a fault detection system disclosed herein.

FIG. 4 is a block diagram depiction of one illustrative embodiment of a fault detection system 250 disclosed herein. As shown therein, the system 250 generally comprises a database having a plurality of PCA models and a corresponding set of statistical key values obtained by applying each PCA model to a respective set of measurement data corresponding to a respective set of process parameters to be monitored during the processing of semiconductor devices, as set forth in block 252, and a fault detection module connected to the database and configured to retrieve summary statistics of at least some of the PCA models and to combine the at least some summary statistics to provide a combined statistical evaluation of at least some of the parameter sets, as set forth in block 254.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   obtaining a plurality of historical measurement data sets, each of said plurality of historical measurement data sets related to a respective parameter set and measured during processing of semiconductor devices in a manufacturing environment;
   establishing a model for each respective parameter set by using a principal component analysis technique and a respective one of said plurality of measurement data sets related to said respective parameter set;
   obtaining a first measurement data set corresponding to a first parameter set of said parameter sets;
   obtaining a second measurement data set corresponding to a second parameter set of said parameter sets;
   applying a first model corresponding to said first parameter set to said first measurement data set;
   applying a second model corresponding to said second parameter set to said second measurement data set; and
   evaluating said first and second measurement data sets by combining a first statistical value set obtained from said first model and a second statistical value set obtained from said second model.

2. The method of claim 1, further comprising obtaining a combined measurement data set and selecting at least two or more of said models so as to adapt a combined model comprised of said at least two or more models to said combined set of measurement data.

3. The method of claim 1, wherein said first model is established in a first data processing unit and a second model is established in a second data processing unit.

4. The method of claim 3, further comprising storing said first and second sets of statistical values in a common database that is accessible by said first and second data processing units.

5. The method of claim 1, wherein said first and second sets of statistical values comprise at least a first metric for a model prediction error, a second metric for a model internal error, a third metric for the number of principal components and one or more metrics for characterizing eigenvector matrices and a correlation matrix.

6. The method of claim 5, further comprising determining a first limit and a second limit for said first and second metrics, respectively, by using the chi-square inverse function, the matrix of the non-principal components, the correlation matrix and the square of the correlation matrix of the first and second models.

7. The method of claim 6, wherein said one or more metrics for characterizing eigenvector matrices and a correlation matrix of each said model comprises a fourth metric obtained by said correlation matrix and a matrix represented by non-eigenvectors of each said model and a fifth metric obtained by the square of said correlation matrix and said matrix represented by non-eigenvectors of each said model.

8. The method of claim 7, wherein combining said first and second sets of statistical values for evaluating said first and second measurement data sets comprises determining statistical limits for a combined model corresponding to said combined first and second measurement data sets by using said first, second, third, fourth and fifth metrics of the first and second models.

9. The method of claim 8, wherein determining said statistical limits of said combined model comprises determining a first combined limit for a model prediction error of said combined model by using a sum of said fourth metrics and a sum of said fifth metrics of each said model used in said combined model.

10. The method of claim 9, further comprising determining a second limit for a model internal error of said combined model by using a sum of said third metrics of each said model used in said combined model.

11. The method of claim 10, further comprising determining a third limit by using said first and second limits, a sum of the fourth metrics of said first and second models, a sum of said fifth metrics of said first and second models and a sum of said third metrics of said first and second models.

12. A method of fault detection in a semiconductor manufacturing process sequence, the method comprising:
   applying a first PCA model to a first set of measurement data related to a process result of said semiconductor manufacturing process sequence and corresponding to a first parameter set;
   determining a first set of summary statistical values for evaluating said first parameter set;
   applying a second PCA model to a second set of measurement data related to said process result of said semiconductor manufacturing process sequence and corresponding to a second parameter set;
   determining a second set of summary statistical values for evaluating said second parameter set; and
   combining said first and second sets of summary statistical values so as to commonly evaluate said first and second measurement data.

13. The method of claim 12, further comprising establishing a plurality of PCA models for a plurality of parameter sets measured after performing said manufacturing process, and evaluating at least a subset of said plurality of parameter sets and said first and second parameter set by selecting a combined model by using stored statistical key values of said first and second PCA models and at least one of said plurality of PCA models, wherein said combined model corresponds to said at least a subset.

14. The method of claim 12, further comprising building said first model on the basis of first historical measurement data related to said first set of measurement data and building said second model on the basis of second historical measurement data related to said second set of measurement data and storing a first set of statistical key values of said first model and a second set of statistical key values of said second model in a database.

15. The method of claim 14, wherein said first model is built in a first data processing unit and said second model is built in a second data processing unit.

16. The method of claim 12, wherein said first and second sets of measurement data correspond to measurements performed on the same substrate after performing said manufacturing process, wherein said first and second parameters sets are different.

17. The method of claim 16, further comprising applying a third PCA model to a third set of measurement data corresponding to a third set of parameters, wherein said third set of measurement data relates to said process result and wherein a third set of summary statistical values is generated.

18. The method of claim 17, wherein said third set of parameters differs from said first and second parameters sets and said first, second and third sets of measurement data are obtained from the same substrate.

19. The method of claim 17, wherein said third set of parameters differs from said first and second parameters sets and said first, second and third sets of measurement data define a combined set of measurement data, and wherein said first, second and third models are applied separately to a combined set of measurement data of a plurality of substrates.

20. A fault detection system, comprising:
   a database comprising a plurality of PCA models and a corresponding set of statistical key values obtained by applying each PCA model to a respective set of measurement data corresponding to a respective set of process parameters to be monitored during the processing of semiconductor devices; and
   a fault detection module connected to said database and configured to retrieve summary statistics of at least some of said PCA models and to combine said at least some summary statistics to provide a combined statistical evaluation of at least some of said parameter sets.

* * * * *